United States Patent [19]

Grudkowski et al.

[11] Patent Number: 4,661,923
[45] Date of Patent: Apr. 28, 1987

[54] LARGE BANDWIDTH SAW ADAPTIVE PROCESSOR ARRANGEMENT

[75] Inventors: Thomas W. Grudkowski; Gary K. Montress, both of Glastonbury, Conn.

[73] Assignee: United Technologies Corporation, Hartford, Conn.

[21] Appl. No.: 665,815

[22] Filed: Oct. 29, 1984

[51] Int. Cl.$^4$ ............................................. G06G 7/195
[52] U.S. Cl. ............................... 364/821; 310/313 R; 333/150; 333/193; 364/825
[58] Field of Search ............... 364/821, 825, 728, 819, 364/824; 333/150-154, 193-196; 310/313 R, 313 A, 313 B, 313 C, 313 D

[56] References Cited

U.S. PATENT DOCUMENTS

| | | | |
|---|---|---|---|
| 3,903,406 | 9/1975 | London | 310/313 B X |
| 4,191,933 | 3/1980 | Montress et al. | 333/194 X |
| 4,224,683 | 9/1980 | Adkins | 364/821 |
| 4,244,037 | 1/1981 | Jelks | 367/121 |
| 4,247,903 | 1/1981 | Grudkowski et al. | 364/861 X |
| 4,315,228 | 2/1982 | Moore | 333/196 X |
| 4,398,163 | 8/1983 | Feldmann et al. | 333/195 X |

OTHER PUBLICATIONS

R. A. Monzingo and T. W. Miller, *Introduction to Adaptive Arrays*, (Wiley–Interscience 1980).
S. W. Merritt, G. K. Montress, T. W. Grudkowski, *GaAs SAW/MESFET Programmable Asynchronous Correlator With Complex Tap Weighting* (United Technologies Research Center.
B. Widrow, P. E. Mantey, L. J. Griffiths, and B. B. Goode, "Adaptive Antenna Systems," Proc. of the IEEE, vol. 55, No. 12, pp. 2143-2159, Dec. 1967.
S. P. Applebaum, "Adaptive Arrays," IEEE Trans. on Antennas and Propagation, vol. AP-24, pp. 585-598, Sep. 1976.
J. M. McCool and B. Widrow, "Principles and Applications of Adaptive Filter: A Tutorial Review," IEEE Conf. Publ., 144, p. 84 (1976).
C. F. N. Cowan, et al, "An Evaluation of Analogue and Digital Adaptive Filer Realization," IEE Conf. Proc. No. 180, Sep. 1979.
D. Corl, "A. C.T.D. Adaptive Inverse Filer," Electronics Letters, vol. 14, No. 3, pp. 60-62, Feb. 1978.
W. K. Masenten, "Adaptive Signal Processing," IEE Conf. Proc. No. 180, Sep. 1980, pp. 168-177.
P. M. Grant and G. S. Kino, "Adaptive Filters Based on SAW Monolithic Storage Correlator," Electronics Letters, vol. 14, No. 17, pp. 562-564, Aug. 17, 1978.
J. E. Bowers, G. S. Kino, D. Bekar, and H. Olaisen, "Adaptive Deconvolution Using a SAW Storage Correlator," IEEE Trans. on Microwave Theory and Techniques vol. MTT-29, No. 5, pp. 491-498, May 1981.
R. T. Webster: A Programmable Filter on GaAs, 1981 IEEE Ultrasonics Symposium Proceedings, Nov. 1981.

*Primary Examiner*—Joseph Ruggiero
*Attorney, Agent, or Firm*—Robert P. Sabath

[57] ABSTRACT

A large bandwidth, tapped delay line (TDL) surface acoustic wave (SAW) adaptive processor arrangement, for processing a plurality of array values employed as tap weights in the TDL device. The weight quantities may be real or complex. In the complex case, no phase quadrature combiner is required as a result of the technique of offsetting the real and imaginary delay lines, or offset launching of the frequency waveforms to be mixed.

2 Claims, 5 Drawing Figures

LARGE BANDWIDTH SAW ADAPTIVE PROCESSOR ARRANGEMENT

The Government has rights in this invention pursuant to Contract No. F19628-82-C-0065 awarded by the Department of the Air Force.

DESCRIPTION

1. Technical Field

This invention is directed toward the technology of signal processing and particularly the technology of signal processing with adaptive array processors and surface acoustic wave (SAW) devices.

2. Background Art

The use of adaptive array processors in signal processing arrangements permits the adaptive optimization of processor weighting coefficients to minimize the effect of undesired information received with a signal carrying other information which is of significant interest. Adaptive processors suppress undesirable interfering signals while simultaneously enhancing desired singal reception. Such processors can further be employed with other techiques for enhancing signal to noise ratios, according to well-known spread spectrum techniques, for example, thereby extending the performance of the combined system over the performance that would be achievable by either technique individually. Ser Monzingo, R. A. and Miller, T. W. in *Introduction to Adaptive Arrays* (Wiley-Interscience 1980) for a general discussion of adaptive arrays.

Prior adaptive array processor techniques have utilized either analog or digital techniques which were implemented at relatively low system bandwidths, generally below about one megahertz.

Recent work moreover has directed attention toward the use of bucket-brigade devices and charge coupled devices to provide sampling rates in adaptive processing from tens of kilohertz to several meghertz by implementing the Widrow LMS algorithm.

Additionally, adaptive array processors using SAW technology have been implemented, including SAW tapped-delay lines with external weighting and control elements to provide real time implementation of the LMS algorithm. These approaches, while demonstrating that SAW tapped delay lines could be employed effectively at megahertz signal bandwidths, are hampered by the use of relatively cumbersome external circuitry to implement the arrangement.

SUMMARY OF THE INVENTION

According to the invention herein, an adaptive array processor employs a field effect transistor (FET) tapped surface acoustic wave (SAW) delay line having programmable amplitude and phase control at each tap thereof. The arrangement includes mixers within the tapped delay lines. An LMS technique is implemented using a separate delay line channel to sample each desired tap weight for adaptation. The tap weights are automatically adjusted through the LMS technique. Automatic feedback for adjusting the tap weights is provided through the circuit arrangement effective for implementing the LMS technique.

According to one version of the invention, a first SAW line is established for adjacent real and imaginary signal processing with their outputs combined in phase quadrature.

According to yet another version of the invention, the signal launching portions of said first SAW line device are staggered by a phase quadrature factor.

According to another version of the invention, the real and imaginary portions of the first SAW line are staggered by the phase quadrature factor.

This arrangement is effective to compensate for radar interference, signal propagation distortion, jamming and carrier wave signal interference.

BEST MODE FOR CARRYING OUT THIS INVENTION

Figure 1:
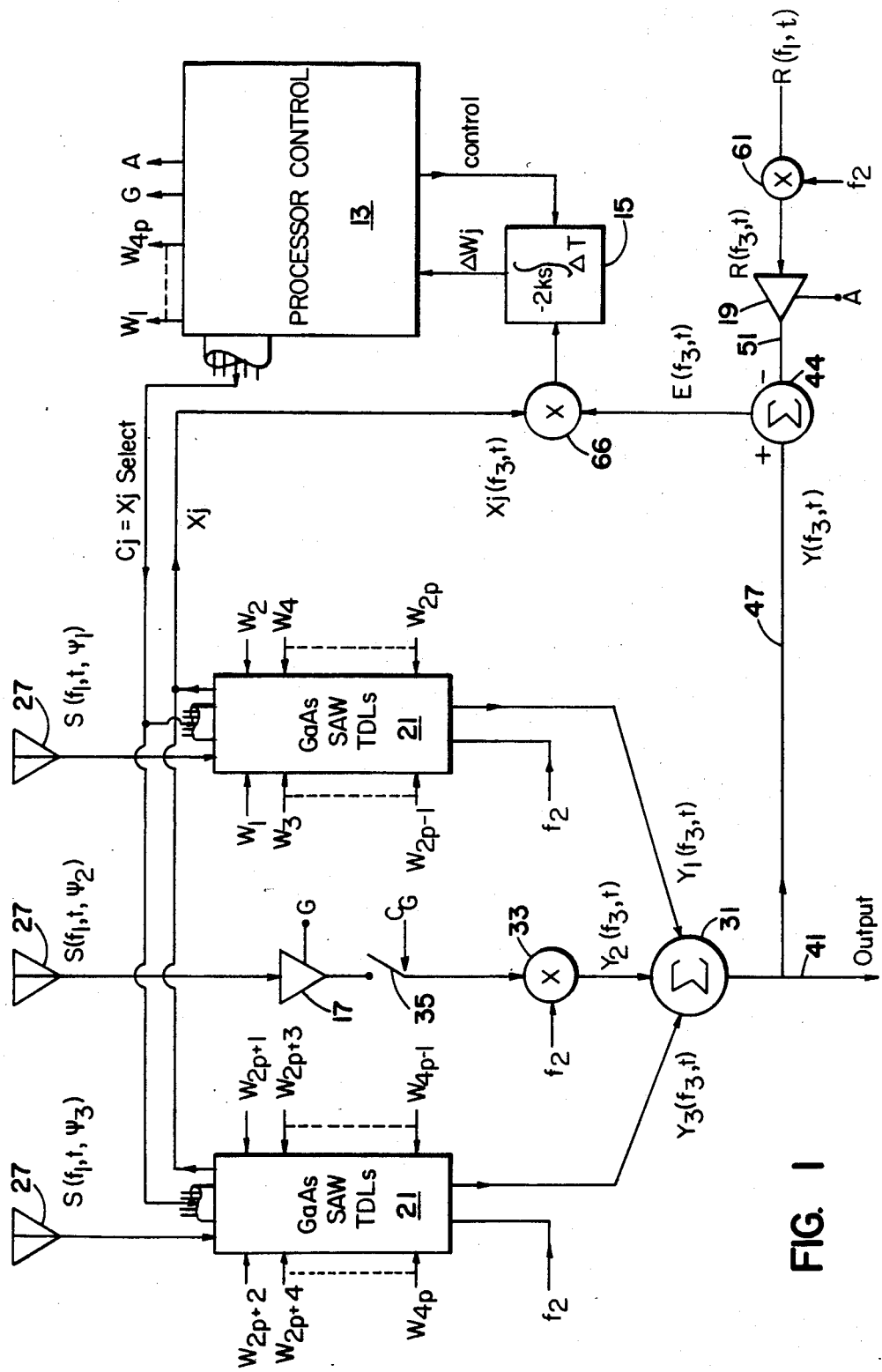
FIG. 1 is a general schematic showing the adaptive array processor in accordance with the invention herein.

FIG. 1 shows an arrangement according to the invention herein, including a processor control device 13 for storing preselected weight quantitites Wj for suppressing at taps to be discussed below, unwanted signal components in a received radio frequency signal carrying desired information. Each selected weight quantity is supplemented in processor memory 13 with a corresponding delay value Cj. An analog integrator 15 produces positive or negative additive ($+/-$) values "delta Wj" with respect to complex tap weight quantitites Wj.

The arrangement implements the following well-known LMS algorithm: $Wj = -2ks$ multiplied by the integral over a specified time interval "delta T" of quantity $[E(t,f_3)X(t,f_3)dt]$, where Wj is the weight at a given tap, "ks" is a constant greater that zero controlling the rate of convergence of the integral and its stability, $E(t,f_3)$ is the error between the array processor output $Y(t,f_3)$ at line 41 and a desired response waveform $R(f_3,t)$ times a predetermined gain level "A", and $X(t,f_3)$ is a sample of the input signal subject to a predetermined delay period corresponding to a particular value of Cj. FIG. 1 further shows the invention schematically including two tapped delay lines 21 each subject to a plurality of complex tap weights "Wj" from process controller 13, where "j" is a integer from one to "n". Each of the delay lines 21 is connected to a selected one of antenna 27. The invention requires but a single one of delay lines 21.

A third selectable channel having a constant phase delay and variable gain may be additionally provided.

The weights Wj are adjusted by control of the mixing efficiency and the positive or negative phase of the integrated gallium arsenide field effect transistor taps through which opposing signal at frequency f1 and local oscillator at frequency f2 surface acoustic waves propagate.

The processor 13 in turn produces each of updated real or complex weight quantities Wj in terms of DC bias values W1 to W4p (or say W1 to W2p in the case of real weight quantities alone) representing real and imaginary tap weights, where "p" is a preselected number of the complex quantitites and "2p" includes the same number of real and imaginary components thereof on respective sides of one SAW device as will be seen. Accordingly "4p" is the total number of weight quantities of interest for a version of the invention addressed herein which includes two tapped delay lines 21. Of course, as many parallel tapped delay lines as desired can be employed in accordance with this invention.

Processor 13 further produces signed values "G" and "A" respectively indicative of gain in amplifier 17 and the gain in amplifier device 19 as will be seen below.

Beyond this, processor 13 produces "1" and "0" values of quantities $Cj=Xj$ select which are communicated to SAW TDL (tapped delay line), devices 21. These devices preferably are made of Galium Arsenide (GaAs) material, which is piezoelectric. In the alternative, a silicon substrate could be employed with a thin film layer of zinc oxide or aluminum nitride for example superimposed thereover.

Each of delay devices 21 is preferably fabricated on the same GaAs substrate using the same photo mask to insure identical characteristics. A first one of delay line devices 21 receives weight W1 through W2p, while the other one of delay line devices 21 receives the remainder of the weight quantity indications W2p+1 through W4p. Additional delay line devices 21 could be incorporated into the arrangement as another version of the invention.

Each of delay line devices 21 and amplifier 17 are subject to signal input from a corresponding one of antennae 27, and each of the delay devices 21 is subject to frequency input f2.

Further, the outputs of respective delay devices 21 are signals Y(f3,t) and Y3(f3,t) according to one embodiment of the invention. These signals are passed to summer 31 for additive combination. 31 also receives input signal Y2(f3,t) from mixer 33 which is subject to input frequency f2 and a selective input from amplifier 17 through switch 35 (also CG) under control of processor 13.

The combined signal Y, as modified by Y1 or Y3 or both, passes from summer 31 and is output along line 41. It is then fed back to another summer 44 along line 47. Summer 44 includes an negative input 51 for input of a reference signal derived from the quantity R[(f1,t)] passing through amplifier 19 and mixer 61 subject to frequency input f2 as shown in FIG. 1. Reference signal R[(f1,t)] operates at frequency f3. Its gain, moreover, is controlled through input value A.

The output of summer 44 is in turn fed to mixer 66 which combines the Xj outputs from delay devices 21, which are then forwarded to integrator 15. Integrator 15 applies the LMS algorithm to develop change-quantities "delta Wj" for processor 13.

Figure 2:
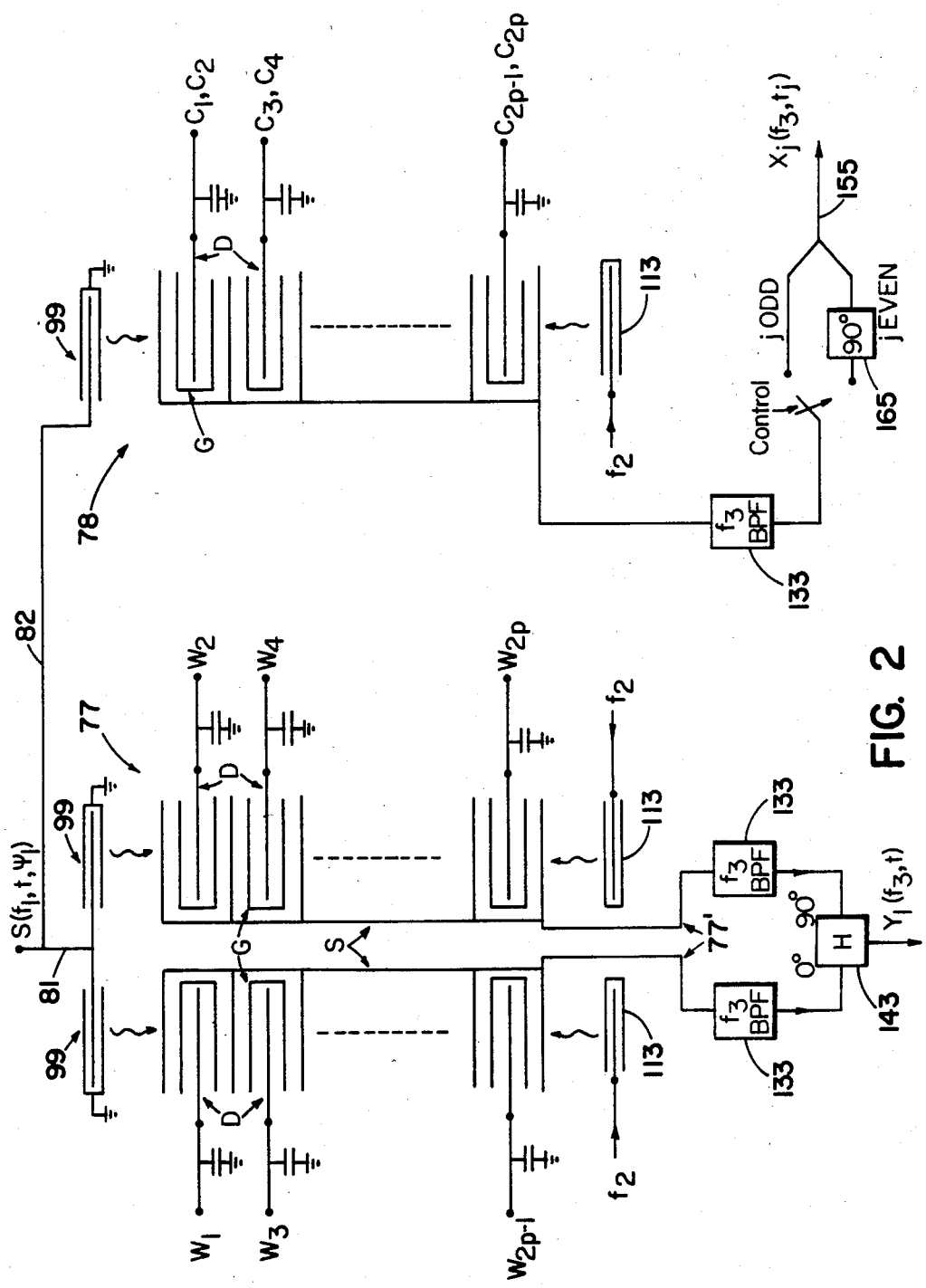
FIG. 2 is the schematic of a single one of the tapped delay lines of the adaptive array processor.

FIG. 2 shows a portion of the invention in greater detail. In particular, the details of one of delay devices 21 is shown.

Each of delay devices 21 is subject to arbitrary input signals S(f,t,psi), where f1 is a first frequency, "t" represents time and "psi" is a Greek lettef indicative of the phase of input function "S". More particularly, one of antennae 27 produces input signals according to a first phase relationship "psi$_1$". Another of antennae 27 produces input signals according to a second phase relationship "psi2". Finally, even another of antennae 27 produces input signals according to phase relationship "psi3". Of course, as already noted, additional ones of antennae 27 could be incorporated into this invention in conjunction with additional delay devices 21.

Examining FIG. 2 more closely, signals according to input function S(f,t,psi2) are applied to first and second surface acoustic wave (SAW) devices respectively 77 and 78 along respective leads 81 and 82. Each such SAW device 77, 78 includes a launching portion 99 for launching signals according to the input signal "S" onto devices 77 and 78 for transmission acoustically.

SAW device 77 additionally includes a mixing portion comprising "2p" FET drain taps (in the complex case). In particular SAW device 77 is subject to tap input of staggered complex weight quantity inputs W1, through W2p, which are successively spaced at increasing distances from launch site 99. SAW device 78 on the other hand is subject to inputs C1, through C2p. Mixing frequency f2 is launched onto respective SAW devices 77 and 78 with launch portions 113 thereof. A similar real case can be implemented as well.

For a first tap of device 77, W=W1+jW2. Internal mixing within the SAW FET mixers produces the signal output at f3, corresponding to the separate outputs of the real and imaginary channels of device 77 which are then summed in phase quadrature at combiner 143.

The output signals from SAW devices 77 and 78 depart on source leads 77' i.e. "S" therefrom through respective band pass filters (BPFs) 133 to remove spurious signals at frequencies f1 and f2. The signals from the source leads of SAW device 77 are combined in hybrid quadrature combiner device 143 to generate accurately output complex tap weight signal Y1,(f3,t). Further, the output from SAW device 78 is controlably applied to output lead 155 to produce output signal Xj(f3,tj), directly for odd "j" values, and through phase shifter 165 for even values of "j" in accordance with selection by a control switch indicated and subject to control by controller 13.

In operating iteration with respect to tap weights Wj is performed by correlation of the error signal E(f3,t) with the received signal Xj at the jth tap where both E and Xj are at output frequency f3. Following multiplication at mixer 66, the DC value of the combined function E(f3,t)X(f3,t) is integrated and scaled by convergence factor 2ks. The integrator output over the interval "delta T" corresponds to the change in tap adjustment "delta Wj".

For example, for a 60 megahertz bandwidth, the time delay between taps is accordingly 16.7 nanoseconds, so that the total intergration time required for eight complex taps is 270 nanoseconds.

Multiple integration at the jth tap may be desirable to increase the integration time for compatibility with a selected microprocessor speed, or for increasing the integrator signal-to-noise ratios.

Initial and updated tap weights are stored digitally in processor memory, so that iteration on weights Wj for j equals one to 4p can be performed sequentially. After integration time "delta T" has transpired, the processor 13 selects a next tap for adaptation. The selection of the weight Wj occurs for ci equal to one. In particular, when i equals j; "i" equals zero, when i does not equal j.

Figure 3:
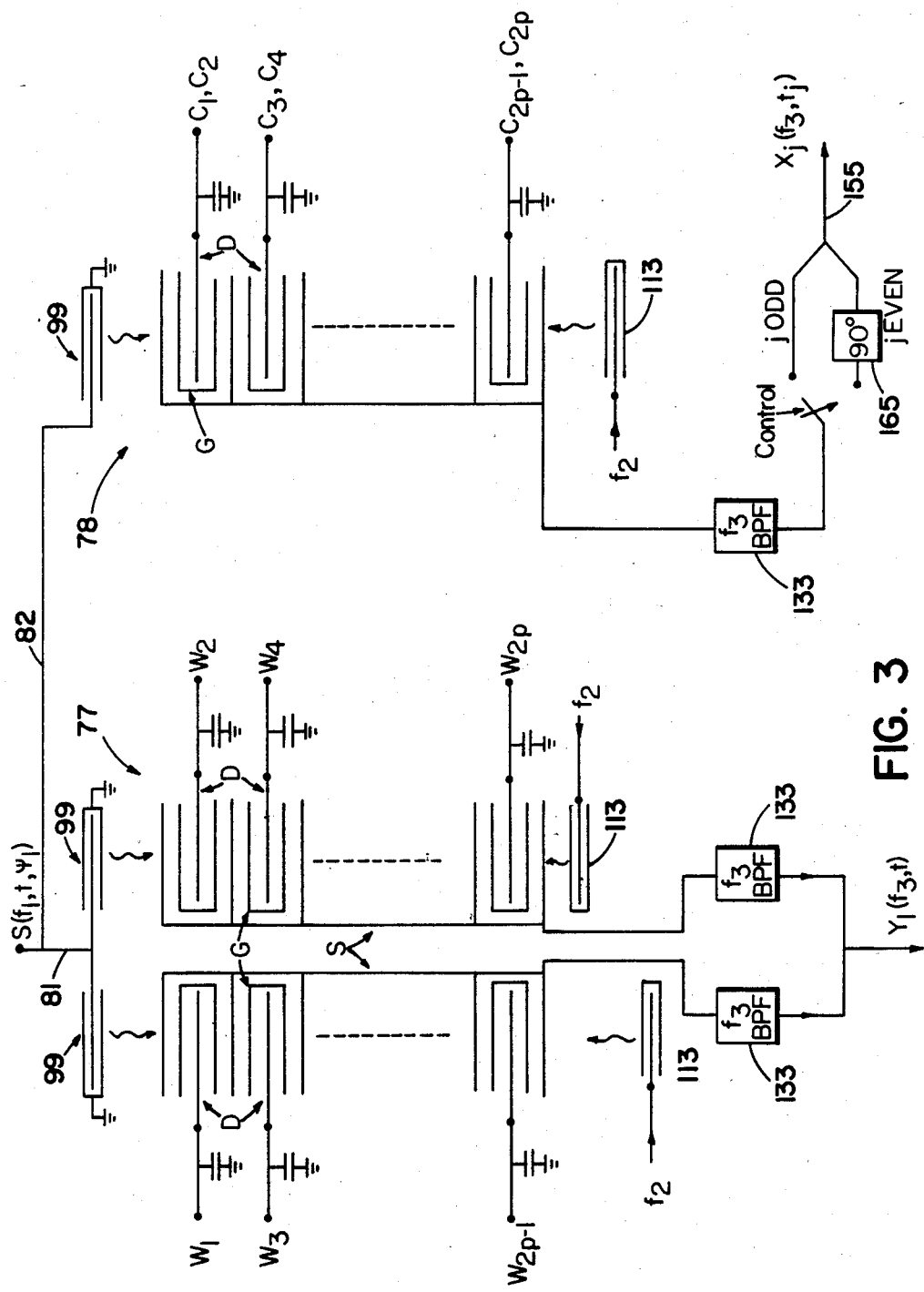
FIGS. 3 and 4 show other versions of the tapped delay line in which the launching elements of a first SAW device are staggered according to a predetermined relationship.
Figure 4:
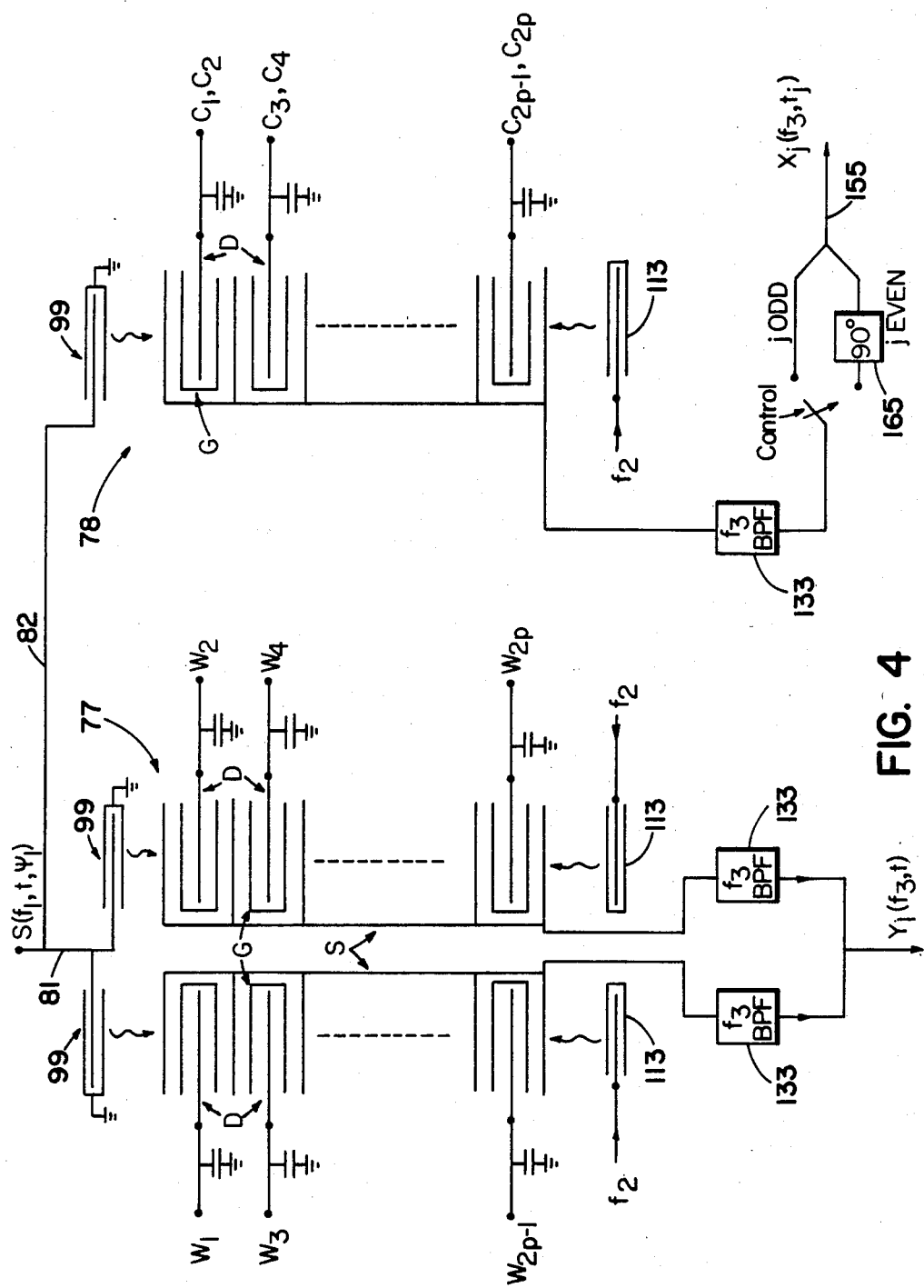
Figure 5:
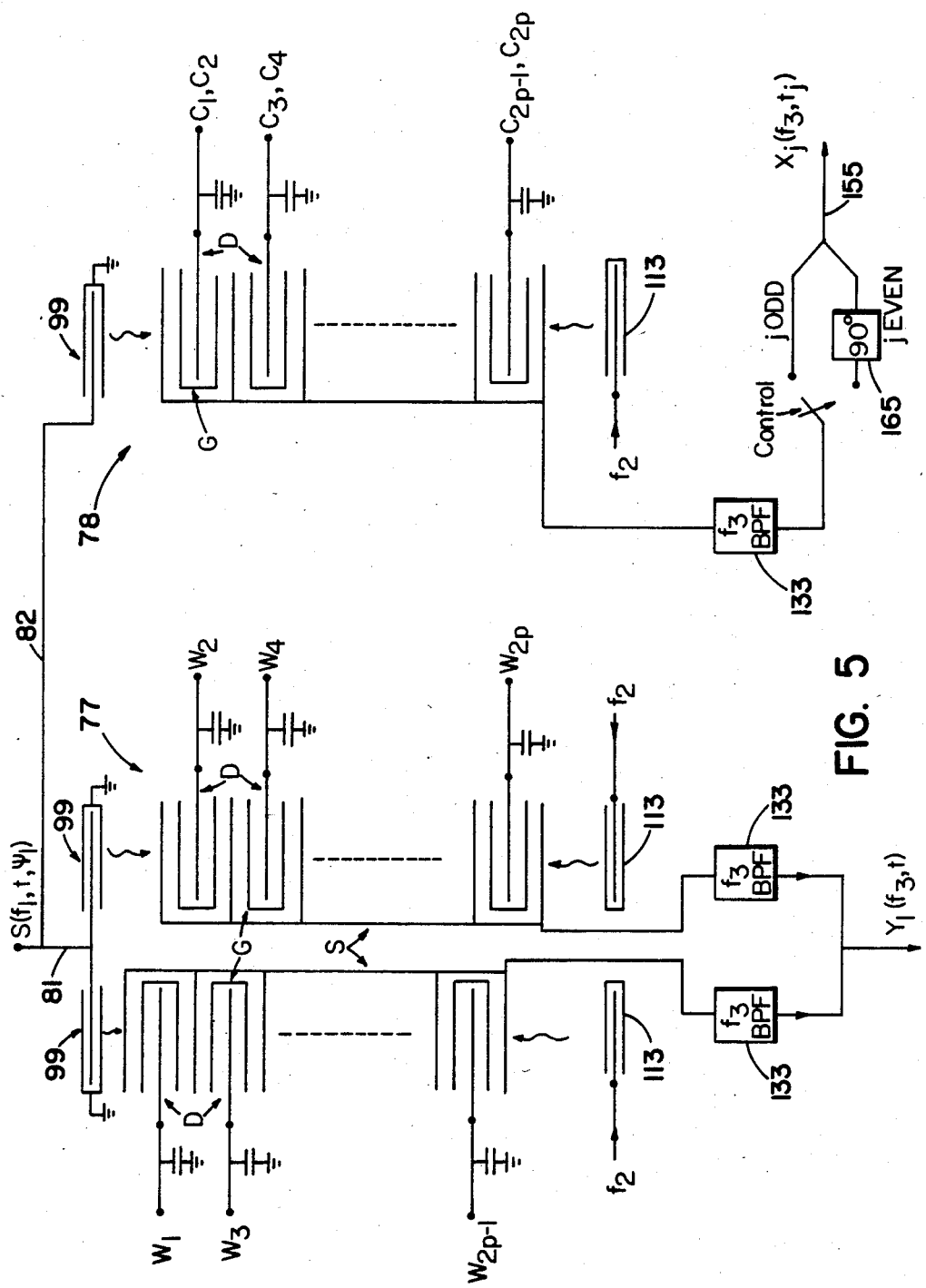
FIG. 5 shows a staggering technique with respect to the adjacent delay lines of said first SAW device.

Alternatively, a quarter wavelength offset between real and imaginary channels for bandpass filters 133 can be implemented, as suggested at FIG. 5, with bandpass filtering is provided at the output of each channel individually for minimizing spurious response. Further, launching portions 99 for signal "S" or launching portions 113 for frequency signal f2 can be staggered as suggested at respective FIGS. 3 and 4. The degree of staggering or offset is determinable by the factor of $y(2n+1)/4$ where "Y" is the selected operating wavelength of said respective SAW devices and "n" is any selected positive or negative integer value.

Processor 13 is preferably an Intel 8751 device or the like. The microcomputer in operation cycles repeatedly through the tap positions as explained above, integrating the product input with respect to each tap, and adjusting the respective tap weight Wj. This is accomplished by first selecting a control tap and an odd or even digital output and then processing the product input. Processing is repeatedly accomplished by resetting the analog integrator to zero, integrating for a precise time period and then placing the integrator into hold. A sample-and-hold circuit then stores the analog value upon processor command. With the integrated product term held as an analog voltage, the microcomputer 13 causes a converter device (not shown) to generate the digital equivalent of the integrator 15 output. This digital value is read by microcomputer 13, multiplied by a scaling factor and loaded into an analog-to-digital convertor register (also not shown). The converter output provides the required analog tap weight signal. Analog outputs are provided to adjust reference signal gain A and channel gain G. These values are determined by the microcomputer in an automatic gain control process.

Accordingly, tap weight values are combined via an averaging algorithm (not shown) to average tap weights Wj in order to generate values A and G. These values maximize processor output and minimize overall error during automatic operation.

The information above may lead individuals skilled in the art to conceive of variations thereof which are nonetheless part of the invention addressed herein. Accordingly, careful reference to the claims which follow is urged, as these alone definitively and with particularity state the metes and bounds of the invention.

We claim:

1. An arrangement for selectively processing a plurality of complex array values employed as corresponding first and second tap weights in a first surface acoustic wave (SAW) device comprising a corresponding first and second adjacent series of field effect transistor (FET) elements effective for mixing oppositely launched radio frequency (RF) signals directed toward each other and said FET elements, said tap weights applied to corresponding ones of said FET elements, wherein said arrangement is characterized by an additional SAW device in parallel with said first SAW device and having an equivalent set of series FET elements and similarly subject to equivalent ones of said oppositely launched RF signals, and is further characterized by said additional SAW device being effective for producing a delay signal indicative of the selected tap weight, whereby the tap weights of said first SAW device are addressable by applying a signal on a corresponding one of said FET elements of said parallel SAW device.

2. The arrangement of claim 1, wherein the output signal of said first SAW device is compared with the value of a selected reference signal and multiplied with its odd and even output signal and then integrated for a selected tap weight as a product with the output signal of said parallel SAW device according to the relationship: $-2ks$ [Integral over a predetermined time period of: $E(f3,t) \times (f3,t)dt$], where "ks" is a selected scaling and gain factor; where $X(f3,t)$ is the delay output of said parallel SAW device at the mixed frequency f3; and $E(f3,t)$ is the error signal resulting from the difference between said reference signal and the sum of the input and output singals of said first SAW device.

* * * * *